Oct. 6, 1970 G. O. HUTH ET AL 3,532,899

FIELD-EFFECT, ELECTRONIC SWITCH

Filed July 25, 1966

INVENTORS
GERALD O. HUTH
RAYMOND A. SCHULZ
ARDEN J. WOLTERMAN

BY Homer L. Knearl
AGENT

United States Patent Office 3,532,899
Patented Oct. 6, 1970

3,532,899

FIELD-EFFECT, ELECTRONIC SWITCH

Gerald O. Huth, Minneapolis, Minn., and Raymond A. Schulz, Owego, and Arden J. Wolterman, Apalachin, N.Y., assignors to International Business Machines Corporation, Armonk, N.Y., a corporation of New York Filed July 25, 1966, Ser. No. 567,453
Int. Cl. H03k *17/56*
U.S. Cl. 307—251 2 Claims

ABSTRACT OF THE DISCLOSURE

An electronic switch circuit in which two field effect transistors are serially connected with a common source and common gate connection wherein the drain of the first field effect transistor is the input terminal and where a switching voltage to turn on and turn off the field effect transistors is applied between the common source and common gate connection through series connected diodes.

This invention relates to an improved field-effect electronic switch. More particularly, this invention relates to a high speed electronic switch using field-effect controlled current devices.

It is well known to use a single field-effect transistor as an electronic switch. Typically the resistance between the source and drain terminals of the field-effect transistor is controlled by the voltage between the gate terminal and the source terminal of the transistor. If the source to gate voltage exceeds the pinch off voltage, current from drain to source is blocked and the transistor is in an OFF state. On the other hand if the source to gate voltage is very low, current flows from the drain to source, and the transistor is in an ON state.

For the purpose of further discussion of the prior art and also for the description of the invention it will be assumed that the field-effect transistors are N-channel devices (the material between the source and drain is N-type semiconductor material). It will be appreciated by one skilled in the art that P-channel devices could be used simply by reversing the polarity of voltages. Accordingly, an N-channel transistor can be turned off by making the source so much more positive than the gate that the pinch-off voltage is exceeded. To turn the transistor on, the source to gate voltage is reduced to nearly zero.

Two major problems have arisen with the use of a single field-effect transistor to perform as an electronic switch. The first problem occurs when the transistor is in the OFF state and is referred to herein as the voltage blocking problem. The second problem occurs when the field-effect transistor is in the ON state and is referred to herein as the capacitive cut-off problem.

The gist of the voltage blocking problem is that when in the OFF state the transistor can block more voltage between the drain and source terminals in one direction than in the other direction. When the drain terminal is more positive than the source terminal, relatively large drain-to-source voltages may be blocked; however, when the source terminal is more positive than the drain terminal, the drain to-source voltage which can be blocked is relatively small, regardless of the magnitude of the reverse bias on the gate terminal. For example, while a typical field-effect transistor can block a forward drain-to-source voltage of 30 volts, it can only block a reverse drain-to-source voltage of 7 volts. This effectively means that the useful voltage range on the source terminal and the drain terminal would be limited to pulse or minus 3.5 volts.

This gist of the capacitive cut-off problem is that high frequency A.C. input signals are rectified by the source to gate P–N junction causing a negative charge to build up on the gate terminal until eventually the transistor is pinched off. The common remedy for this problem is to connect a resistor between the source and the gate terminals of the transistor. The resistor permits the negative charge to bleed off. However, the big disadvantage of this remedy is that it destroys the isolation between the analog signal being switched and the drive signal controlling the switching. In other words the analog signal applied to the drain terminal and the switching signal applied to the gate terminal are now connected through a resistor which causes the switching signal to distort the analog signal.

It is an object of this invention to perform electronic switching with field-effect controlled devices wherein the switch in the OFF state is equally tolerant to positive or negative input or output voltages.

It is a further object of this invention to perform electronic switching with field-effect controlled devices wherein the switch passes high frequency signals without being subject to capacitive cut-off and wherein the analog signal is not distorted by the switching signal.

In accordance with this invention the above objects are accomplished by serially connecting field-effect controlled devices wherein there is a common gate and common source connection, and the switching drive to turn the control devices on and off is applied between the common source and common gate connection. The analog signal being switched flows, when the switch is in an on condition, through the conductive channels of the field-effect controlled devices connected in series. The field-effect controlled devices are turned on and off by a drive circuit which includes a first unilateral current device connected to the common gate connection, a second unilateral current device connected to the common source connection and a resistive element connected between the common gate connection and the common source connection. The purpose of the first unilateral current device is to clamp the common gate connection, when the unilateral current device is conducting, to a voltage which insures that current through the field-effect control devices will be pinched off. The purpose of the second unilateral current device is to clamp, when the unilateral device is conducting, the common source connection to a voltage which insures both of the field-effect control devices will be biased in the forward source to drain direction while in the OFF state. The purpose of the resistive element is to provide a bias for the unilateral current devices and also to provide a low resistance path between the common source connection and the common gate connection when the field-effect current devices are in the ON state.

The great advantage of applicants' invention is first that, when the field-effect controlled devices are in the OFF state, the voltage from source to drain is constrained to be in a favorable voltage blocking direction. In other words, for an N-channel field-effect controlled device the voltage at the common source connection is clamped such that the drain terminal of the field-effect controlled devices is at a higher voltage than the source terminal. This means that much larger voltage swings can be tolerated at the input and output terminals of the switch without causing the field-effect controlled devices to become conducting.

Another great advantage of our invention is that, when the field-effect controlled devices are conducting, the low resistance element between the common source connected and the common gate connection bleeds off any negative charge built up in the field-effect controlled devices. If this charge were not bled off, it would act to turn off the field-effect devices. Since the negative charge is caused by high frequency A.C. signals, this bleed off of negative charge in effect means that a higher frequency A.C. signal may be passed through the switch. Another advantage of our invention is that while the negative charge is being bled off of the field-effect controlled devices, isolation is maintained between the analog signal being switched and the drive signal doing the switching. This advantage arises through the use of the unilateral current devices to turn the switch on and off.

The foregoing and other objects, features and advantages of the invention will be apparent from the following more particular description of preferred embodiments of the invention, as illustrated in the accompanying drawings.

Figure 1:
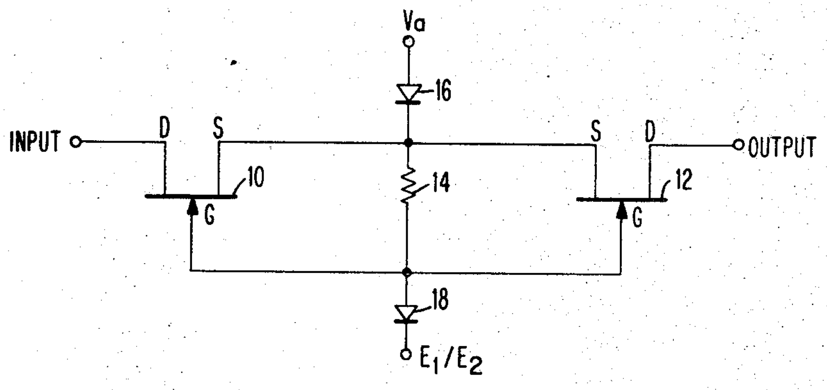
FIG. 1 shows one preferred embodiment of the invention wherein a linear resistive element is used between the common source connection and the common gate connection.

Referring to FIG. 1, one of the preferred embodiments of the invention is shown. Field-effect transistors 10 and 12 are connected in series by having their source terminals connected. The drain terminal of transistor 10 serves as the input to the switch, while the drain terminal of transistor 12 serves as the output. The gate terminals of transistors 10 and 12 are also connected to form a common gate connection. Resistive element 14 is connected between the common source connection and the common gate connection. In addition diode 16 is connected between the common source connection and a bias voltage $V_a$, while diode 18 is connected to the common gate connection and a switching signal denoted as E1/E2.

Figure 3:
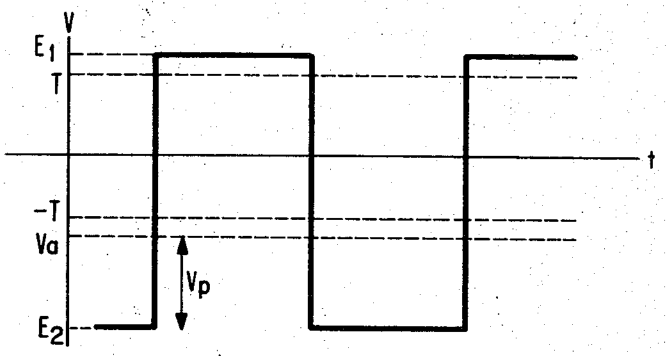
FIG. 3 shows the voltage levels supplied to the terminals of the switch.

To understand that relative magnitudes of the voltages applied to the switch, reference is now made to FIG. 3. The bi-level waveform is the drive signal which turns the switch on and off. The upper level of the drive signal is E1 and the lower level is E2. This drive signal is applied to the cathode of diode 18. The voltage levels T and —T shown in dotted lines represent the maximum voltage swings occurring on the input and output terminals. The voltage level $V_a$ represents the D.C. bias which is applied to the anode of diode 16.

In operation the switch is turned off, when the drive signal is at voltage level E2. Because E2 is a voltage lower than $V_a$ the diodes 16 and 18 are conducting. This effectively clamps the common source connection of the two field-effect transistors 10 and 12 to the voltage $V_a$ and the common gate connection of the same transistors to the voltage E2. The voltage drop across resistive element 14 is greater than the pinch-off voltage $V_p$ as indicated by FIG. 3. Therefore, the transistors 10 and 12 are held in an off or non-conducting condition when the drive signal is at the level E2.

While in the off or non-conducting state, as just pointed out the voltage at the common source connection of the transistors is clamped to the bias voltage $V_a$. As shown in FIG. 3, the voltage level $V_a$ is below either the voltage level T or —T. Therefore, the bias from the drain to source across both of the field-effect controlled transistors will always be in the forward or favorable voltage blocking direction. For this reason greater voltage swings will be permitted on the input or output terminals before there is any danger of forcing the transistors into an undesired conducting state.

To turn the switch on, the voltage level of the drive signal is changed to E1. This causes the diodes 16 and 18 to become reverse biased and therefore non-conducting. The voltage drop across resistor 14 then essentially falls to zero and permits the transistors 10 and 12 to become conducting. Essentially whatever voltage is supplied at the input terminal will now appear at the output terminal assuming the output load is a significantly greater resistance than that of the field-effect transistors in the conducting state. While the switch is in the ON state, the resistance 14 which is a low resistance acts to discharge any negative charge built up in the transistors due to A.C. signals passing through the switch. The lower the value of the resistance 14 the faster the charge on the transistors will be bled off, and the higher the frequency which the switch will pass.

Figure 2:
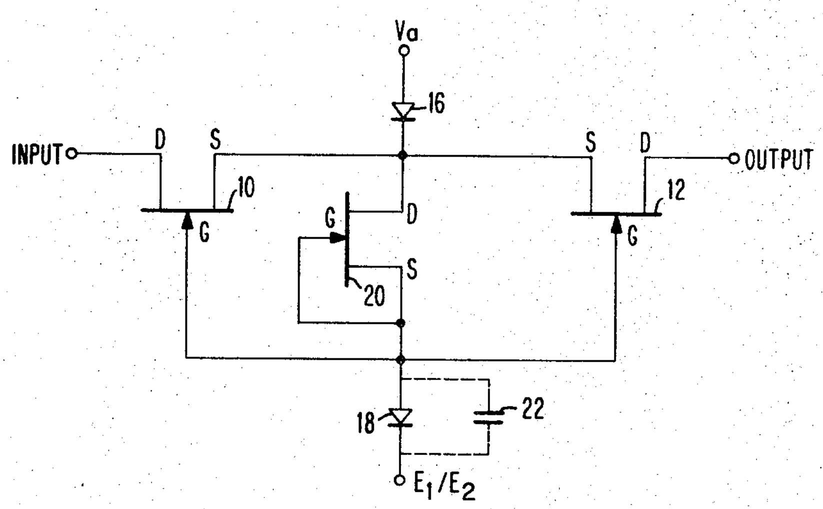
FIG. 2 shows another preferred embodiment of the invention wherein a non-linear resistive element is used between the common gate connection and the common source connection.

The other preferred embodiment of the invention shown in FIG. 2 operates in identically the same manner as the embodiment in FIG. 1 except that the switch is faster and has a higher frequency pass characteristic. The reason for the increase in switching speed and high frequency pass characteristics is the substitution of a field-effect transistor 20 for the resistor 14 in FIG. 1. More particularly the reason is that the field-effect transistor 20 has a non-linear resistance characteristic which may be advantageously used to turn the switch on and also to bleed off charge in the transistors 10 and 12 while the switch is on.

In turning the switch on, the speed of the switch is determined by how fast the charge in any stray capacitance of the field-effect transistors 10 and 12 can be discharged. Field-effect transistor 20 is particularly efficient in discharging this capacitance because initially when the voltage is high the transistor 20 acts as a constant current drain. In effect as the voltage due to the capacitance falls off, the resistance of the transistor 20 also decreases maintaining the discharge current at a constant level. Of course eventually the voltage across the transistor 20 approaches zero and by this time the resistance of the transistor 20 has dropped to a very low level. In contrast, resistor 14 would produce a normal exponential decay of the charge stored in the transistors 10 and 12.

The transistor 20 is also particularly adapted for use in the switch because of its non-linear resistance characteristics. For example, when the switch is off, the resistance in the transistor 20 is at a relatively high level due to the voltage applied across it. This is necessary to insure that the transistors 10 and 12 will be pinched off. On the other hand when the switch is on, the voltage across the transistor 20 is low and thus the resistance through the transistor 20 is also low. This means that transistor 20 then acts as a very low resistance to bleed off the negative charge built up in transistors 10 and 12 by a high frequency input signal. This very low resistance of the transistor 20 means that the switch can effectively pass a higher frequency A.C. signal.

If desired, additional switching speed can be achieved by placing a capacitor 22 across diode 18. Then when the drive signal changes from level E2 to E1, a pulse of current will be introduced into transistors 10 and 12 to discharge them. However, this gain in speed is bought at the consequence of introducing transients into the switch.

As has been noted previously in the introductory remarks, one of the great advantages of this switch is that the signal being switched is entirely isolated from the drive signal doing the switching. This is achieved because when the switch is on and passing the analog signal, diodes 16 and 18 are reverse biased completely blocking out the drive signal. On the other hand, when the drive signal acts to turn the transistors 10 and 12 off, transistors 10 and 12 being nonconducting isolate the input-output signal from the drive signal.

It will be obvious to one skilled in the art that our invention could just as easily be implemented with P-type semiconductors rather than the N-type semiconductors shown in the preferred embodiments. While the invention has been particularly shown and described with reference to preferred embodiments thereof it will be understood by those skilled in the art that the foregoing and other changes in form and details may be made therein without departing from the spirit and scope of the invention.

What is claimed is:

1. A field-effect transistor switch for high frequency switching comprising:

a first field-effect transistor having a drain terminal, a source terminal and a gate terminal, the drain terminal being the input for the switch;

a second field-effect transistor having a drain terminal, a source terminal and a gate terminal, the drain terminal being the output for the switch, the source terminal being connected to the source terminal for said first field-effect transistor forming a common source connection, the gate terminal being connected to the gate terminal of said first field-effect transistor forming a common gate connection;

a resistive element connected between the common source connection and the common gate connection wherein said resistive element is a field-effect transistor providing, first, a constant current drain while said first and second field-effect transistors are being switched from a non-conducting to a conducting state, and second, a low resistance path while said first and second field-effect transistors are in a conducting state;

a first diode connected between a voltage supply and the common source connection;

a second diode connection between a two-level voltage supply and the common gate connection;

said diodes being forward biased when the output from the two-level voltage supply is at a first level, said diodes being reverse biased when the output from the two-level voltage supply is at a second level;

said resistive element providing a pinch-off voltage to hold both said field-effect transistors in a non-conducting state when said diodes are forward biased, said resistive element providing a low resistance path between the sources and gates of said field-effect transistors when said diodes are reverse biased, so that said field-effect transistors will be in a conducting state between their source and drain terminals.

2. A high speed electronic switch comprising:

two field-effect current devices having their controlled current paths connected in series to form a common current path connection and having their gates connected to form a common gate connection;

a non-linear resistive element connected between the common current path connection and the common gate connection;

a first unilateral current device connected to the common current path connection to clamp, when said first unilateral current device is conducting, the common current path connection to a voltage level that insures both said field-effect current devices are biased in the favorable voltage blocking direction while in a non-conducting state;

a second unilateral current device connected to the common gate connection to clamp, when said second unilateral current device is conducting, the common gate connection to a voltage level that insures both said current-controlled devices are kept in a non-conducting state;

a switching signal source biasing said second unilateral current device with a first voltage level to switch both said unilateral conducting devices to a conducting state and with a second voltage level to switch both said unilateral conducting devices to a non-conducting state;

said non-linear resistive element, when said unilateral current devices are non-conducting, providing a low resistance path between the common current path connection and the common gate connection so that the controlled current paths of said field-effect current devices are conducting, when said unilateral current devices are conducting, providing a high resistance path between the common current path connection and the common gate connection so that the controlled current paths of said field-effect current devices are non-conducting.

References Cited

UNITED STATES PATENTS

| | | | |
|---|---|---|---|
| 3,215,859 | 11/1965 | Sorchych. | |
| 3,251,161 | 5/1966 | Owen | 307—251 X |
| 3,386,053 | 5/1968 | Priddy | 307—251 X |

ROY LAKE, Primary Examiner

J. B. MULLINS, Assistant Examiner

U.S. Cl. X.R.

307—304